United States Patent
Miyakawa et al.

(10) Patent No.: US 6,342,275 B1
(45) Date of Patent: Jan. 29, 2002

(54) METHOD AND APPARATUS FOR ATMOSPHERIC PRESSURE PLASMA SURFACE TREATMENT, METHOD OF MANUFACTURING SEMICONDUCTOR DEVICE, AND METHOD OF MANUFACTURING INK JET PRINTING HEAD

(75) Inventors: Takuya Miyakawa; Hiroaki Akiyama; Shintaro Asuke, all of Suwa (JP)

(73) Assignee: Seiko Epson Corporation, Nagano-ken (JP)

( * ) Notice: Subject to any disclaimer, the term of this patent is extended or adjusted under 35 U.S.C. 154(b) by 0 days.

(21) Appl. No.: 08/505,343
(22) PCT Filed: Dec. 22, 1994
(86) PCT No.: PCT/JP94/02196
§ 371 Date: Dec. 28, 1995
§ 102(e) Date: Dec. 28, 1995
(87) PCT Pub. No.: WO95/18249
PCT Pub. Date: Jul. 6, 1995

(30) Foreign Application Priority Data

Dec. 24, 1993 (JP) ............................................. 5-327643

(51) Int. Cl.$^7$ ............................. C08J 7/18; C08F 2/52; H05H 1/34
(52) U.S. Cl. ....................... 427/488; 427/489; 427/490
(58) Field of Search ............................... 427/488, 489, 427/490, 491, 255.32; 118/719, 726, 723 E (56) References Cited

U.S. PATENT DOCUMENTS

| | | | |
|---|---|---|---|
| 3,762,941 A | * 10/1973 | Hou | ............................ 427/488 |
| 4,012,307 A | 3/1977 | Phillips | ....................... 204/192 |
| 4,430,547 A | 2/1984 | Yoneda et al. | |
| 4,705,593 A | 11/1987 | Haigh et al. | ................. 156/635 |

(List continued on next page.)

FOREIGN PATENT DOCUMENTS

| | | |
|---|---|---|
| EP | 371 693 | 6/1990 |
| JP | 59-158525 | 9/1984 |
| JP | 60-1862 | 1/1985 |
| JP | 61-127866 | 6/1986 |
| JP | 2-190489 | 7/1990 |
| JP | 2-281734 | 11/1990 |
| JP | 3-174972 | 7/1991 |
| JP | 3-219082 | * 9/1991 |
| JP | 3-236475 | * 10/1991 |
| JP | 4-186619 | 7/1992 |
| JP | 6-190269 | 12/1992 |
| JP | 6-2149 | 1/1994 |

Primary Examiner—Marianne Padgett
(74) Attorney, Agent, or Firm—Stroock & Stroock & Lavan LLP (57) ABSTRACT

Gas discharge is caused in a predetermined discharging gas at atmospheric pressure or a pressure close to atmospheric pressure, and an organic material which is liquid at room temperature and which is previously contained in the discharging gas or applied to a surface of a treated member is dissociated or excited by a plasma caused by the gas discharge to generate activated species. By using these excited activated species, a polymerized film of organic material is formed on the surface of the treated member. By variously selecting the organic material or the kind of the discharging material and variously combining them, a water repellent film, a hydrophilic film or a film having a high hardness can easily be formed on the surface of the treated member according to use, or the polymerization speed of the organic material can be increased, or the polymerization can be limited. Further, the adhesion of an organic polymerized film essentially low can be improved with respect to a treated member formed of an inorganic material such as glass or some inactive organic material if the organic material or the kind of gas is used while being changed.

3 Claims, 9 Drawing Sheets

U.S. PATENT DOCUMENTS

| | | | |
|---|---|---|---|
| 4,708,766 A | 11/1987 | Hynecek | 156/643 |
| 4,749,440 A | 6/1988 | Blackwood et al. | 156/646 |
| 4,845,054 A * | 7/1989 | Mitchner | 427/255.3 |
| 4,857,382 A | 8/1989 | Liu et al. | 428/156 |
| 4,921,157 A | 5/1990 | Dishon et al. | |
| 5,000,819 A | 3/1991 | Pedder et al. | |
| 5,006,363 A * | 4/1991 | Fujii et al. | 427/255.32 |
| 5,045,166 A | 9/1991 | Bobbio | |
| 5,120,568 A * | 6/1992 | Schuurmans et al. | 427/488 |
| 5,126,164 A * | 6/1992 | Okazaki et al. | 427/491 |
| 5,140,003 A * | 8/1992 | Mueller | 427/255.37 |
| 5,147,520 A | 9/1992 | Bobbio | |
| 5,178,682 A | 1/1993 | Tsukamoto et al. | 118/722 |
| 5,201,995 A | 4/1993 | Reisman et al. | |
| 5,225,659 A | 7/1993 | Kusano et al. | |
| 5,240,559 A | 8/1993 | Ishida | 456/666 |
| 5,276,012 A * | 1/1994 | Ushida et al. | 427/255.32 |
| 5,280,012 A * | 1/1994 | Kirlin et al. | 427/255.32 |
| 5,290,378 A * | 3/1994 | Kusano et al. | 427/490 |
| 5,292,370 A | 3/1994 | Tsai et al. | |
| 5,316,739 A | 5/1994 | Yoshikawa et al. | |
| 5,340,618 A * | 8/1994 | Tanisaki et al. | 427/488 |
| 5,368,685 A | 11/1994 | Kumihashi et al. | 156/643 |
| 5,384,167 A | 1/1995 | Nishiwaki et al. | 427/569 |
| 5,391,855 A | 2/1995 | Tanisaki | |
| 5,399,830 A | 3/1995 | Maruyama | |
| 5,407,121 A | 4/1995 | Koopman et al. | |
| 5,449,432 A | 9/1995 | Hanawa | |
| 5,456,945 A * | 10/1995 | McMillan et al. | 427/255.32 |
| 5,494,712 A * | 2/1996 | Hu et al. | 427/489 |
| 5,499,754 A | 3/1996 | Bobbio et al. | |
| 5,597,438 A | 1/1997 | Grewal et al. | |
| 5,677,010 A * | 10/1997 | Esser et al. | 427/488 |
| 5,958,510 A * | 6/1999 | Siuaramakrishnam et al. | 427/488 |

* cited by examiner

METHOD AND APPARATUS FOR ATMOSPHERIC PRESSURE PLASMA SURFACE TREATMENT, METHOD OF MANUFACTURING SEMICONDUCTOR DEVICE, AND METHOD OF MANUFACTURING INK JET PRINTING HEAD

BACKGROUND OF THE INVENTION

1. Technical Field

The present invention relates to a surface treatment method for forming a film on the surface of treated members formed of various materials including inorganic materials such as metal, ceramic and glass, and certain inert organic materials by using atmospheric-pressure plasma, and an apparatus for practicing the method. Further, the present invention relates to a method of manufacturing a semiconductor device utilizing such a surface treatment method or a method of manufacturing an ink jet type printing head.

2. Background Art

CVD (Chemical Vapor Deposition) methods or the like are widely known as conventional methods of forming film of a high molecular compound by polymerizing a monomer. In general, in a CVD method, thin film is formed by chemical reaction on a surface heated at a high temperature of several hundred degrees or higher. On the other hand, as a technique for forming a thin film at a comparatively low temperature, plasma CVD methods are known in which excited activated species are made by electric discharge in an organic gas atmosphere at a reduced pressure of, for example, 10 to 1000 Pa to cause polymerization reaction. A method and an apparatus for polymerization using electric discharge in such a manner are described on page 216 of "Khobunshi Hyomen Gijutsu (High Molecular Surface Technique)" written by Toshio Fujiyoshi (edited by Khobunshi Gakkai Khobunshi Hyomen Kenkyu-Kai) and published by Nikkan Khogyo Shinbun-Sha (1987).

A polymerization method based on this plasma CVD technique, however, requires special kinds of equipment such as a vacuum chamber and a vacuum pump and, hence, a large, complicated and high-priced apparatus because the reaction takes place under a condition of reduced pressure. Moreover, for discharge processing, it is necessary to reduce the pressure in the vacuum chamber from atmospheric pressure to a vacuum, to maintain this condition and to again change the pressure from the vacuum to atmospheric pressure after discharge processing. A long time and a large amount of labor are required for this process. Further, because of a need to dispose members to be processed in the vacuum chamber, it is difficult to arrange an in-line or field process, to use a large member to be processed and to perform processing for localized film formation.

Surface treatment methods or apparatuses for forming thin film or improving a surface quality by using excited gas plasma of an organic or inorganic compound at atmospheric pressure, provided to solve the above-described problems of the conventional art, are disclosed in Japanese Patent Laid-Open Publication Nos. 306569/1989, 15171/1990, 219082/1991, 236475/1991, 241739/1991, and 358076/1992.

Further, in Japanese Patent Laid-Open Publication Nos. 263444/1991, 136184/1992 and 145139/1992 is described a method of surface-treating a base member by an atmospheric-pressure plasma treatment to make chemical plating or to manufacture a composite member.

The inventors of the present invention have also proposed, in the specification of Japanese Patent Application No. 309440/1993, a surface treatment method and an apparatus which enable good soldering on the surface of substrates or the like formed of various materials by causing electric discharge in a gas containing at least an organic material under atmospheric pressure to form excited activated species and by pre-treating the surface of the substrate or base member with the excited activated species.

The present invention has been achieved by improving the above-described conventional art and the surface treatment methods previously proposed and an object of the present invention is to provide an atmospheric-pressure plasma surface treatment method and an apparatus for use with the method which can be arranged comparatively simply for reductions in size and cost, which enable an organic material selected according to use, operating conditions and the like to be polymerized or an inorganic material to be deposited to form a film on the surface of a treated member in a short period of time in comparison with the conventional art, and which ensure improved productivity and performance suitable for an in-line/field process.

Another object of the present invention is to provide an atmospheric-pressure plasma surface treatment method which makes it always possible to achieve good adhesion between a film formed in this manner and a treated member even if the adhesion between the film and the treated member is essentially low.

Still another object of the present invention is to provide a method and an apparatus which make it possible to perform surface treatment by generating excited activated species of an organic material comparatively safely even if the organic material used is inflammable as in many cases.

Still a further object of the present invention is to provide a semiconductor device manufacturing method which ensures that the desired insulation between bonding wires can easily be maintained even with a reduction in size of the semiconductor device (IC) and the reduction in the pitch between bonding pads with the miniaturization and the increase in density of electronic parts, whereby an improvement in yield can be achieved, and reductions in the size and the manufacturing cost of equipment and apparatus can be also achieved with a comparatively simple arrangement, which reduces the treatment time, and which makes it possible to provide an inline process and to further improve the productivity.

Still a further object of the present invention is to provide, in the ink jet printing art of providing a multiplicity of fine jet holes in a surface facing a printing surface, and performing printing by selectively jetting ink by the operation of piezoelectric elements, a printing head manufacturing method of a high productivity which enables ink to be jetted smoothly so that there is substantially no scattering or dispersion of ink, and so that sharp, fine, high-quality printing is possible, which makes it possible to reduce the size and cost of equipment and apparatus by adopting a comparatively simple arrangement, which reduces the treatment time, and which enables an inline process.

DISCLOSURE OF INVENTION

According to the present invention, there is provided an atmospheric-pressure plasma surface treatment method characterized by causing gas discharge in a predetermined discharging gas at atmospheric pressure or a pressure close to atmospheric pressure to generate excited activated species of an organic material which is liquid at room temperature, and forming a film on a surface of a treated member by using the excited activated species. This organic material may be previously included in the discharging gas to directly cause gas discharge, or may be supplied to the surface of the treated member on which the film is to be formed or to a position in the vicinity of the same to generate its excited activated species by being exposed to excited activated species of the discharge gas generated by the gas discharge.

According to the present invention, to realize the above-described atmospheric-pressure plasma surface treatment method, there is provided an atmospheric-pressure plasma surface treatment apparatus characterized by comprising means for causing gas discharge in a predetermined discharging gas at atmospheric pressure or a pressure close to atmospheric pressure, means for supplying the discharging gas to this gas discharge generation means, and means for exposing a surface of a treated member to excited activated species of an organic material which is liquid at room temperature, the excited activated species being generated by the gas discharge.

According to the present invention, this organic material may be variously selected to polymerize an organic material on the surface of the treated member so that a film having various characteristics according to use can easily be formed, or so that the film formation speed is increased to improve the surface treatment ability and the productivity. If the organic material is silicone, a fluoric solution or a hydrocarbon, a water-repellent film is formed on the surface of the treated member. In the case of an organic material having a hydrophilic group, a film having high hydrophilic property is formed. In the case of silicone, an unsaturated compound, a cyclic compound or an organic metallic compound, the hardness of the surface of the treated member can be increased by the formed film. Further, if the organic material is an unsaturated compound, a cyclic compound or a compound having a crosslinking structure, the film forming speed of the polymerized film can be largely increased.

According to the present invention, if the discharging gas comprises a gas of nitrogen or fluorocarbons, the formation of the polymerized film of the organic material can be promoted. Conversely, if a gas of oxygen or a chemical compound containing oxygen is supplied, the polymerization of the organic material can be limited. Therefore, it is possible to partially limit the formation of the polymerized film according to a need by selectively feeding such a gas to the surface of the treated member and to a region surrounding the same separately from the discharging gas and by controlling the distribution of the gas.

According to the present invention, there is also provided an atmospheric-pressure plasma surface treatment method characterized by comprising causing gas discharge in a predetermined discharging gas at atmospheric pressure or a pressure close to atmospheric pressure to generate excited activated species of oxygen and an organic material which is liquid at room temperature and which contains inorganic element, and forming a film on a surface of a treated member by using the excited activated species. According to this method, the existence of oxygen enables the inorganic element contained in the organic material or an oxide of the organic element to be formed as a film.

According to the present invention, the film formation by gas discharge can be continued while the amount of oxygen used is being reduced. In such a case, it is possible to gradually change the film on the surface of the treated member from a film of an inorganic material to the polymerized film of the organic material. Therefore, even if the adhesion of the polymerized film of the organic material to be formed on the surface of the treated member is low, it is possible to form a polymerized film by first forming a film of an inorganic element or an oxide of the same having good adhesion and by thereafter adjusting the amount of used oxygen so that the desired polymerized film is finally completed.

According to the present invention, there is further provided an atmospheric-pressure plasma surface treatment method characterized by comprising causing gas discharge at atmospheric pressure or a pressure close to atmospheric pressure in a predetermined discharging gas of oxygen or a compound containing oxygen or nitrogen to generate excited activated species, and forming a film on a surface of a treated member by using the excited activated species. According to this method, the surface of the treated member can become hydrophilic.

According to the present invention, there is provided an atmospheric-pressure plasma surface treatment method characterized by comprising mixing an organic material which is liquid at room temperature in a discharging gas by heating the organic material at a temperature not higher than its flash point of the material so that organic material is evaporated, causing gas discharge in the discharging gas at atmospheric pressure or a pressure close to atmospheric pressure to generate excited activated species, and forming a film on a surface of a treated member by the excited activated species. This method ensures that an inflammable organic material can be safely mixed in discharging gas to cause gas discharge.

In the present invention, if two or more organic materials which are liquid at room temperature are used, each material is evaporated by being heated and the materials are mixed in discharging gas in the order of the lowest to the highest of the boiling points of the organic materials. Accordingly, with respect the temperature at which one organic material is heated, the temperature of another organic material which is to be next mixed is heated can be higher. Therefore, there is no possibility of the preceding organic material mixed in the discharging gas liquefying by being cooled by the subsequent organic material.

According to the present invention, there is further provided a method of manufacturing a package type semiconductor device by connecting an electric part and leads by wires and by sealing them in a resin, the method being characterized by comprising the steps of causing gas discharge in a predetermined discharging gas at atmospheric pressure or a pressure close to atmospheric pressure before the electronic part and the leads connected by the wires are sealed in the resin, generating, by the gas discharge, excited activated species of an organic material which is liquid at room temperature, and forming an insulating film on the surfaces of the wires by using the excited activated species.

According to the present invention, there is further provided a method of manufacturing an ink jet type printing head having an ink jet surface in which a multiplicity of fine holes for selectively jetting ink are formed by being opposed to a printing side, the method being characterized by comprising the steps of causing gas discharge in a predetermined discharging gas at atmospheric pressure or a pressure close to atmospheric pressure, generating, by the gas discharge, excited activated species of an organic material which is liquid at room temperature and which is silicone, a fluoric solution or a hydrocarbon, and forming a film on the ink jet surface by using the excited activated species.

DETAILED DESCRIPTION OF THE INVENTION

Best Mode For Carrying Out The Invention

Figure 1:
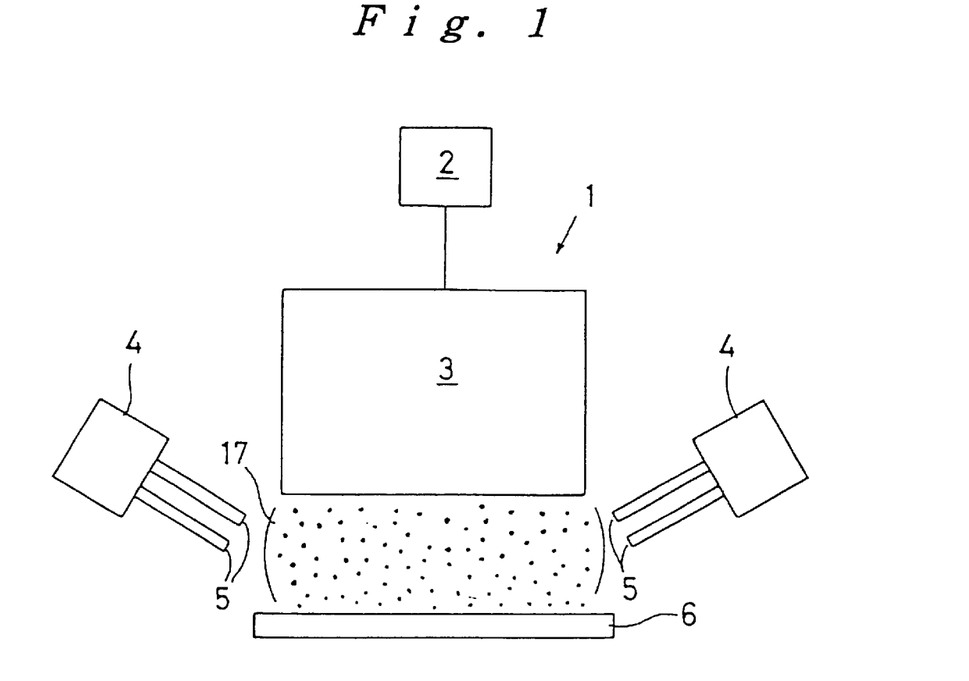
FIG. 1 is a diagram schematically showing the construction of a surface treatment apparatus used in a first embodiment of an atmospheric-pressure plasma surface treatment method in accordance with the present invention.

FIG. 1 schematically shows the configuration of a surface treatment apparatus used for an atmospheric-pressure plasma surface treatment method in accordance with a first embodiment of the present invention. Surface treatment apparatus 1 has a rod-like discharge generation electrode 3 connected to a power source 2, and gas supply units 4 for supplying discharging gas. Gas supply units 4 have openings 5 for ejecting discharging gas to positions in the vicinity of an end of electrode 3. A glass substrate 6, provided as a member to be treated, for example, as a substrate for an LCD, is disposed immediately below electrode 3 with a comparatively small predetermined spacing.

First, the above-mentioned discharging gas is supplied from gas supply units 4 to replace the atmosphere between the end of electrode 3 and substrate 6 and in the vicinity thereof. In this embodiment, as discharging gas, a gas was used which was prepared in such a manner that an organic material in a liquid state at room temperature, selected to perform the desired surface treatment, was mixed in a carrier gas which was a noble gas, such as helium, argon, oxygen, nitrogen, compressed air or the like, capable of facilitating generation of gas discharge under atmospheric pressure. The organic material can easily be mixed in the discharging gas by being heated to a suitable temperature so as to evaporate.

Figure 2:
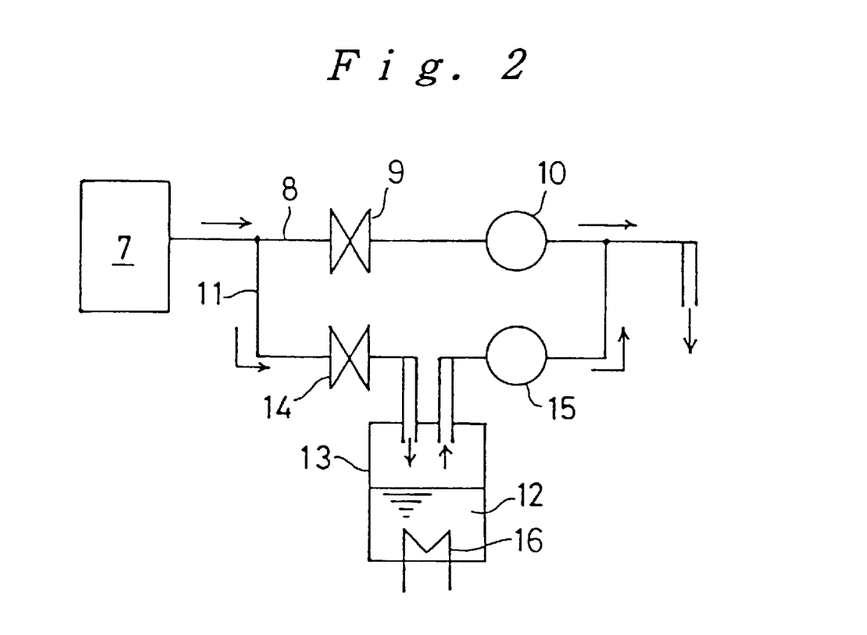
FIG. 2 is a diagram schematically showing an arrangement for mixing an organic material which is liquid at room temperature in a discharging gas by evaporating the organic material.

FIG. 2 illustrates a preferred embodiment for suitably generating such a mixture gas. In a pipe passage for connecting a carrier gas supply source 7 to gas supply units 4, a control valve 9 and a flowmeter 10 for adjusting the flow rate of the carrier gas are provided. A pipe passage 11 for mixing the above-mentioned organic material is also provided which branches off pipe passage 8 so as to connect the opposite ends of control valve 9 and flowmeter 10. As illustrated, an intermediate portion of pipe passage 11 is open in a tank 13 in which liquid organic material 12 is stored. A control valve 14 for adjusting the flow rate of the carrier gas flow into the tank is provided in pipe passage 11 on the upstream side of the tank, while a flowmeter 15 is provided on the downstream side of the tank. A heater 16 for adjusting the temperature of organic material 12 is mounted in tank 13.

Organic material 12 evaporates in tank 13 by being heated by heater 16. Heater 16 is adjusted so that organic material 12 is always maintained at a temperature lower than the flash point of organic material 12 if organic material 12 is inflammable. The carrier gas is supplied to the interior of tank 13 through pipe passage 8 and through pipe passage 11, is mixed with the evaporated organic material and is returned to pipe passage 8 by passing through pipe passage 11. The amount of the discharging gas supplied to gas supply units 4, and the amount or proportion of the organic material contained in the discharging gas are adjusted to suitable values by operating the two control valves 9 and 14 while observing flowmeters 10 and 15.

In another embodiment, the arrangement may also be such that discharging gas such as helium and the evaporated organic material are supplied to gas supply units 4 separately from each other, are mixed with each other in the gas supply units and are ejected to positions in the vicinity of the surface of the substrate 6 and the end of electrode 3.

Next, referring to FIG. 1, a predetermined voltage is applied from power source 2 to electrode 3 to cause gas discharge between electrode 3 end and substrate 6. In a region 17 between electrode 3 and substrate 6 in this discharging state, a plasma is formed, causing reactions in the discharging gas such as dissociation, ionization, excitation or the like, and activated species of the organic material thereby generated in the discharging gas combine and dissociate successively, so that a polymerized film is directly formed from the gas phase on the surface of substrate 6 exposed to the discharge.

The inventors of the present invention made an experiment using helium, argon, nitrogen, oxygen and CF4 as carrier gas and using ethylene, ethane, hexafluoroethane and ethanol as organic material. The result of this experiment was that a polymerized film could be formed on the surface of substrate 6 in each of the cases of using only the organic material as discharging gas, the case of using a mixture gas of the organic materials and the carrier gases and the case of combining different kinds of gas. From this result, according to the present invention, it was found that even an organic material having no double bond can be polymerized on the surface of a treated member. As power source 2, a high-frequency power source of 10 kHz, 400 kHz, and 13.56 MHz was used. The result was the same with respect to these frequencies.

It was also found that the properties of the formed polymerized film varied depending upon the kind of gas. For example, in the case of including at least nitrogen or hydrogen as carrier gas and including no hexafluoroethane as organic material, and in the case of including no $CF_4$ as carrier gas and including at least ethanol as organic material, a film formed which exhibited a hydrophilic property. Conversely, a water-repellent film was formed in the case of including at least hexafluoroethane as organic material and in the case of including at least $CF_4$ as carrier gas.

The inventors of the present invention further made various experiments to find that a water-repellent film can be formed if noble gas such as helium is used as carrier gas and if silicone, a fluoric solution containing fluorocarbon, or hydrocarbon is used as organic material. In particular, a high water-repellent property was obtained in the case of using fluorocarbon. A water-repellent property was also obtained in the case of using a gas containing fluorine, such as $CF_4$, $SF_6$ or $NF_3$ as carrier gas. The water repellent property obtained by using a hydrocarbon as organic material and the water repellent property obtained by using $CF_4$ as carrier gas were substantially equal to each other.

It was also found that a hydrophilic film can be obtained if an organic material contains a hydrophilic group, such as —O—, =O, —OH, ≡N, =NH, —NH—, —NH$_2$, —COOH, or —SO$_3$H. Further, by adding such an organic material, a hydrophilic property could be given to a polymerized film to be formed.

Also, when oxygen, a gas containing oxygen, e.g., $CO_2$, $H_2O$, NOX or the like, or a gas containing nitrogen, e.g., NOX, $NH_3$ or the like, was added or used alone, a hydrophilic property was given to a formed film.

Also, when silicone, an unsaturated compound having a double bond or triple bond, a cyclic compound or an organic metallic compound was used as organic material, the hardness of a film could be increased. In particular, when an organic material such as silicone or an organic metallic compound containing an inorganic element underwent along with oxygen, the organic material portion was removed and a film of the inorganic element or an oxide of the same was obtained. For example, silicone and oxygen underwent discharging to form Si film or $SiO_2$ film usable as an insulating film. This can be formed at substantially the same speed as a polymerized film of an organic material.

Also, when an organic material such as silicone or an organic metallic compound containing an inorganic element underwent gas discharge, a resin film of the organic material containing the inorganic element, i.e., a doped organic material resin film, was formed and the hardness was increased. For example, silicone underwent gas discharge with helium used as carrier gas and with an amount of oxygen smaller than that in the case of the above-mentioned formation of Si film or $SiO_2$ film. A silicone resin film was formed thereby.

Generally, polymerized films of organic materials have low adhesion to treated members made of inorganic materials such as silicon, glass, metal and the like having low wettability, or some inactive organic materials. There is therefore a problem of such films separating easily after film formation. However, it was found that the kind of film formed by discharging with the same organic material in the above-described manner varies depending upon the amount of added oxygen. Then the amount or proportion of oxygen contained in discharging gas is increased at the start of gas discharge so that a resin containing an inorganic material or an inorganic element, or a hydrophilic film is initially formed on the surface of a treated member with suitable adhesion to the same. Thereafter, gas discharge is continued while gradually reducing the amount of oxygen. According to the amount of oxygen, the kind of film formed is changed so as to be close to the desired organic material. Finally, a film of the desired organic material is formed on the surface of the treated member.

Figure 3:
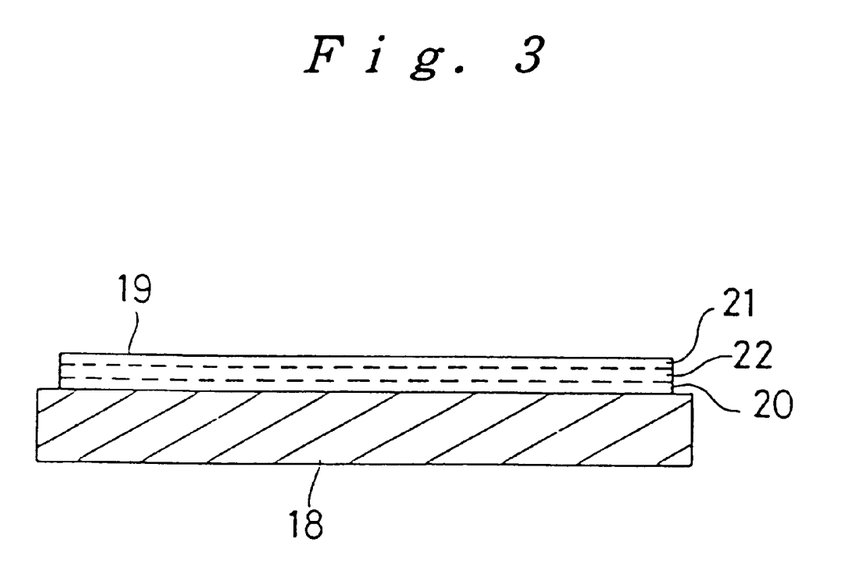
FIG. 3 is a cross-sectional view of a substrate which is formed of an inorganic material, and which has a surface on which a film of an organic material having low adhesion is formed by one method of the present invention.

FIG. 3 shows, in cross-section, a substrate 18 made of an inorganic material, e.g., glass, on which a film of an organic material having low adhesion is formed in this manner. Film 19 formed on the surface of substrate 18 is formed of a lower film layer portion 20 having good adhesion, an upper film layer portion 21 having low adhesion, and an intermediate film layer portion 22 in which the kind of film is changed. In this manner, an organic film such as a water-repellent film essentially low in adhesion can be formed on a glass substrate or the like so as not to separate easily.

In another embodiment, the amount of oxygen contained in discharging gas is abruptly reduced at a time so that the amount of the above-mentioned intermediate film layer portion is substantially zero, and so that film layer portion 21 having low adhesion is formed directly on lower film layer portion 20 having good adhesion. Also, the kind of gas as discharging gas may be changed during gas discharge to laminate a film having low adhesion on a film having good adhesion. The desired film can also be formed on the surface of the treated member in this manner.

Figure 4:
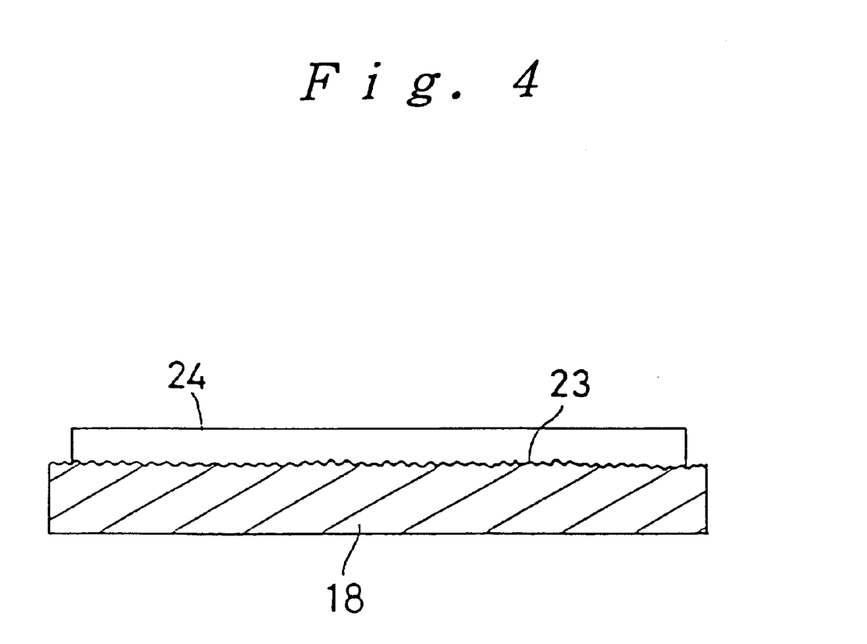
FIG. 4 is a cross-sectional view of a substrate which is formed of an inorganic material, and which also has a surface on which a film of an organic material having low adhesion is formed by another method of the present invention.

FIG. 4 shows another arrangement in which, even in the case of a film such as a water-repellent film essentially low in adhesion, the adhesion to the surface of the above-mentioned treated member made of an inorganic material having low wettability or some inactive organic material can be improved. Upper surface 23 of glass substrate 18 of this embodiment is roughened so that fine irregularities are formed in the entire surface. Film 24 having low adhesion is formed directly on these irregularities. In this manner, the adhesion could also be improved without interposing a film having good adhesion as in the arrangement shown in FIG. 3.

When an unsaturated compound having a double or triple bond, a cyclic compound or a compound having a crosslinking structure was used as organic material in discharging gas, the film formation speed of polymerized film could be about twice as high as that in the conventional art. For example, when a polymerized film was formed on the surface of a glass substrate by using a surface treatment apparatus having a later-mentioned line type electrode structure such as that shown in FIG. 9, the film forming speed was increased to about 2 μm/min. from an ordinary speed of about 1 μm/min.

It was found that polymerization of an organic material can be promoted similarly if discharging gas contains nitrogen, hydrocarbon fluoride or fluorocarbon such as $CF_4$, and that, conversely, polymerization can be limited if oxygen or a gas such as $CO_2$ or $H_2O$ containing oxygen is added. Specifically, if there is a need to avoid film formation in an area on the surface of a treated member, the gas distribution may be controlled so that oxygen is distributed to such an area to prevent the formation of polymerized film in the area.

Figure 5:
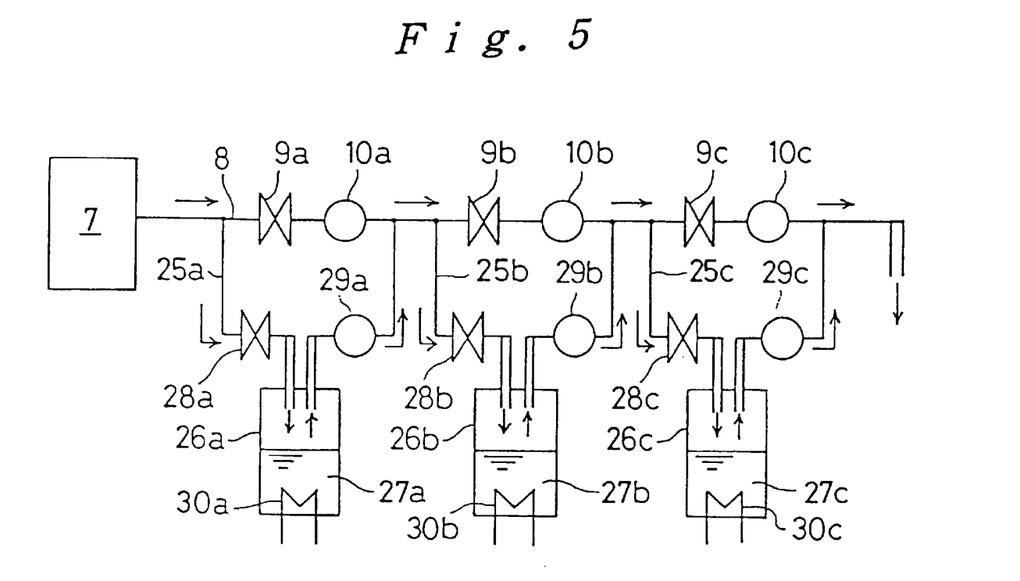
FIG. 5 is a diagram schematically showing an arrangement for mixing three organic materials which are liquid at room temperature in discharging gas by evaporating each material.

As described above, in discharging gas, two or more organic materials can be mixed according to the desired improvement in surface quality, the characteristics, use and the like of a film to be formed. In such a case, for the desired surface treatment, it is important to adjust the ratio of organic materials in discharging gas finally provided for gas discharge to a suitable value. FIG. 5 shows a preferred embodiment for mixing, for example, three organic materials in a discharging gas having helium as carrier gas.

This embodiment is arranged to mix different organic materials, as described below. Three pipe passages 25a to 25c are provided which branch from pipe passage 8 for connecting carrier gas supply source 7 to gas supply units 4 so as to connect opposite ends of each of sets of control valves 9a to 9c and flowmeters 10a to 10c for controlling the carrier gas flow rate, as in the case of the embodiment of FIG. 2. The pipe passages have their respective intermediate portions opened to the interiors of tanks 26a to 26c storing liquid organic materials 27a to 27c, and control valves 28a to 28c and flowmeters 29a to 29c for flow rate control provided on opposite sides of the intermediate portions. Further, heaters 30a to 30c for controlling the temperature of to tanks 26 a to 26c are incorporated in the tanks.

The organic materials evaporated in being heated with the heaters are mixed with the carrier gas supplied through pipe passages 25a to 25c and are supplied to pipe passage 8. However, the carrier gas supplied to pipe passage 25b on the downstream side contains the evaporated organic material 27a, and the carrier gas supplied to pipe passage 25c contains the evaporated organic material 27a and 27b. The amount of the discharging gas supplied to gas supply units 4 and the amounts and proportions of the organic materials mixed in the discharging gas are adjusted to suitable values by flowmeters 10a to 10c, and 29a to 29c, and control valves 9a to 9c, and 28a to 28c, as in the case of FIG. 2.

If pipe passages 25a to 25c are disposed in series to mix the organic materials as described above, it is convenient to provide the materials in the order of the one having the lowest boiling point, the one having a middle boiling point and the one having the highest boiling point in the direction from the upstream side to the downstream side. Then, the temperatures of the organic materials in the tanks can be set by the heaters so as to become higher in the direction from the upstream side to the downstream side, as represented by Ta<Tb<Tc. Accordingly, there is no possibility of each organic material previously mixed in the discharging gas being again liquefied by being cooled in the subsequent tank to be mixed with the different organic material in the tank so that the ratio of the organic materials contained in the discharging gas supplied to the gas supply units 4 cannot be adjusted. Needless to say, if each of the organic materials is inflammable, the corresponding heater is adjusted so that its temperature is maintained always lower than the flash point.

In another embodiment, the arrangement may be such that a pipe passage for supplying carrier gas such as helium and pipe passages for supplying organic materials are disposed in parallel, and the gas and the materials are separately controlled before being supplied to gas supply units 4, are mixed in the gas supply units and are ejected to the abovementioned discharge region.

Figure 6:
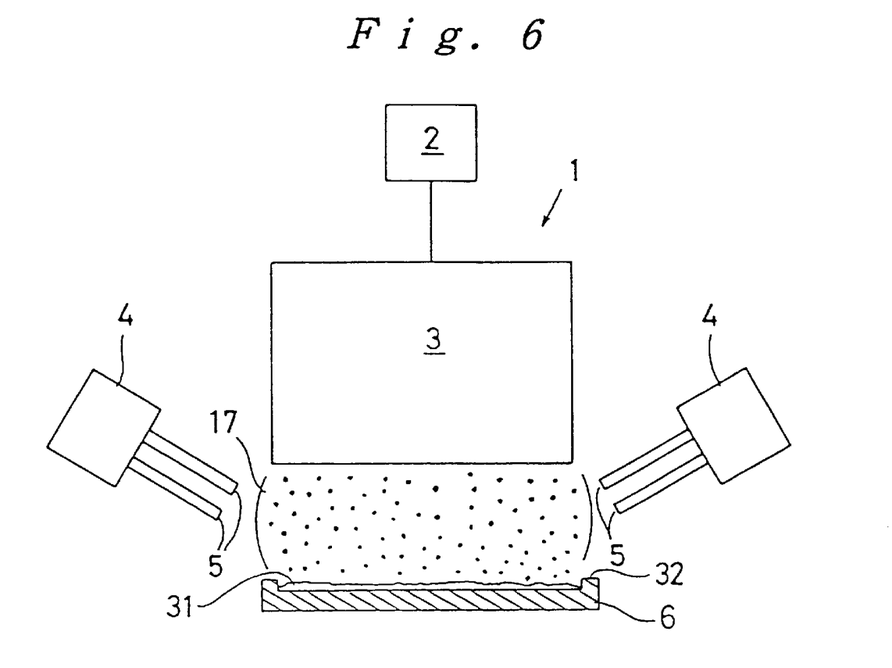
FIG. 6 is a diagram schematically showing a case of practicing a second embodiment of the method of the present invention by using the surface treatment apparatus shown in FIG. 1.

FIG. 6 shows a second embodiment of an atmosphericpressure plasma surface treatment method in accordance with the present invention. In this embodiment, an organic material 31 used for a surface treatment of a glass substrate 6 is previously applied to the surface of the substrate. Since organic material 31 is a liquid, it is convenient to provide a running preventing frame 32 on substrate 6. Frame 32 may be formed integrally with substrate 6. Alternatively, a separate frame member may be disposed on the substrate.

Surface treatment apparatus 1 is arranged in the same manner as the embodiment of FIG. 1. An atmosphere between the end of electrode 3 and substrate 6 and in the vicinity of the same is replaced with discharging gas supplied from gas supply units 4. A predetermined voltage is applied from power source 2 to electrode 3 to cause gas discharge between the end of electrode 3 and substrate 6. A plasma is made in discharge region 17. The abovementioned discharging gas is thereby dissociated, ionized or excited so that the energy state becomes higher. A part of organic material 31 on the surface of substrate 6 is heated and evaporated by the gas discharge and is dissociated or excited by being exposed to the discharge atmosphere in discharge region 17 to become activated species. Organic material 31 remaining on substrate 6 receives energy from activated species of the discharging gas in the high energy state and is thereby dissociated or excited to become activated species. These activated species of the organic materials combine and dissociate successively to form a polymerized film on the surface of substrate 6 directly from the gas or liquid phase.

The inventors of the present invention have made an experiment described below by applying this embodiment. Helium, argon, nitrogen, oxygen and $CF_4$ were used as discharging gas, and 1,7 octadiene, n-octane, perfluorooctane and ethanol were used as organic materials. As a result, it was found that a polymerized film could be formed on substrate 6 with respect to use of any of the kinds of gas or the above-mentioned organic materials, as in the case of the first embodiment, and that even an organic material including no double bond could be polymerized. As power source 2, a high-frequency power source of 10 kHz, 400 kHz, and 13.56 MHZ was used. The result was the same with respect to these frequencies.

The results with respect to variations in characteristics of the formed polymerized film were also the same as in the case of the first embodiment. For example, a hydrophilic property was obtained in the case of including at least nitrogen or hydrogen as discharging gas and including perfluorooctane as organic material, and in the case of including no $CF_4$ as discharging gas and including at least ethanol as organic material. Conversely, a water-repellent property was obtained in the case of including at least perfluorooctane as organic material and in the case of including at least $CF_4$ as discharging gas.

In another embodiment, the arrangement may be such that if two or more organic materials are used for a surface treatment of substrate 6, at least one of the organic materials is applied to the substrate surface while the other organic material is previously evaporated in discharging gas to use a mixture gas, as in the case of the embodiment of FIG. 1.

Figure 7:
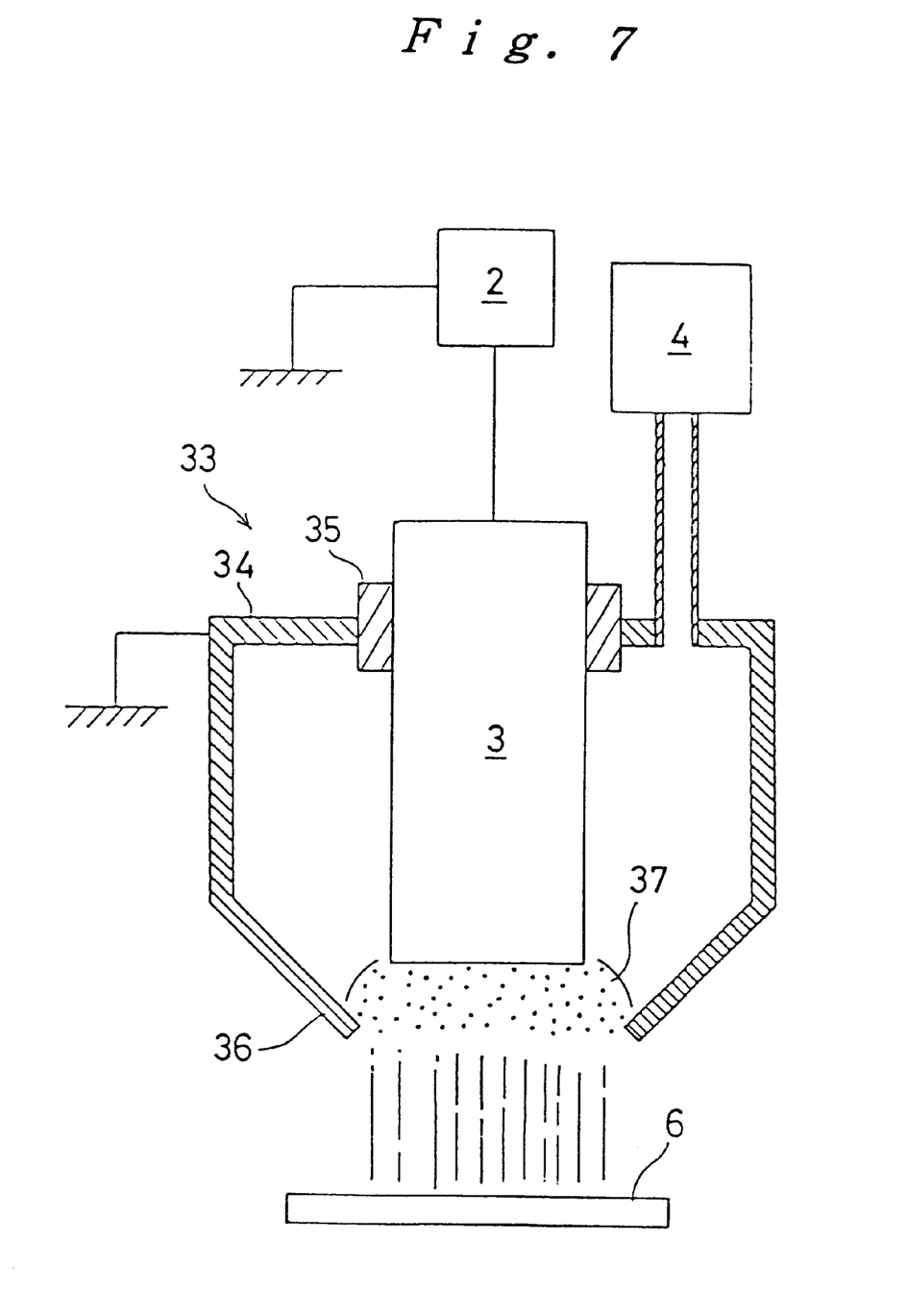
FIG. 7 is a diagram schematically showing another arrangement of the surface treatment apparatus for practicing the first embodiment of the method of the present invention.

FIG. 7 shows a second embodiment of the surface treatment apparatus used in accordance with the present invention. This surface treatment apparatus 33 differs from surface treatment apparatus 1 of FIG. 1 in that electrode 3 connected to power source 2 is accommodated in a grounded metallic cover 34 and is held by an insulating attachment member 35 in an electrically insulated state so as to face vertically downwardly. Also, lower end portions 36 of metallic cover 34 extend to a position in the vicinity of an end of electrode 3 to form a pair of electrodes for discharging. A glass substrate 6 to be surface-treated is disposed below the opening of the metallic cover lower end portions 36 at a predetermined distance therefrom.

Discharging gas containing an organic material is supplied from a gas supply unit 4 which communicates with the cavity in metallic cover 36 to replace an atmosphere in the metallic cover with this gas, as in the embodiment of FIG. 1. Thereafter, a predetermined voltage is applied from power source 2 to electrode 3 to cause gas discharge between the end of electrode 3 and metallic cover lower end portions 36. In a discharge region 37, the discharging gas is dissociated, ionized or excited by a plasma to generate activated species of the organic material. The discharging gas is continuously supplied from gas supply unit 4 to form a downward gas flow from the lower end opening of the metallic cover toward substrate 6. The activated species of the organic material contained in the gas flow are blown to the surface of substrate 6 while combining and dissociating successively, thereby forming a polymerized film directly from the gas phase on the surface.

This surface treatment apparatus 33, unlike the surface treatment apparatus of FIG. 1, has substrate 6 not directly exposed to gas discharge, so that thermal and electrical damages to the substrate can be avoided. An experiment was also made by using various carrier gases as discharging gas and various organic materials and by using a high frequency power source of 10 kHz, 400 kHz and 13.56 MHZ in the same manner as the embodiment of FIG. 1. The same results were thereby obtained.

In another embodiment, metallic cover 34 is extended in a direction perpendicular to the plane of FIG. 7 so as to be formed into a box-like shape with a downwardly-open elongated straight opening defined by its lower end portions, and a thin electrode 3 in the form of a plate is used instead of the rod-like one shown in FIG. 1 by being vertically disposed along the linear opening, thereby enabling the surface of substrate 6 to be linearly processed. Also, even the surface of a large-area substrate can easily be treated by relatively displacing this line type surface treatment apparatus and the substrate in direction perpendicular to the direction of the straight electrode.

Figure 8:
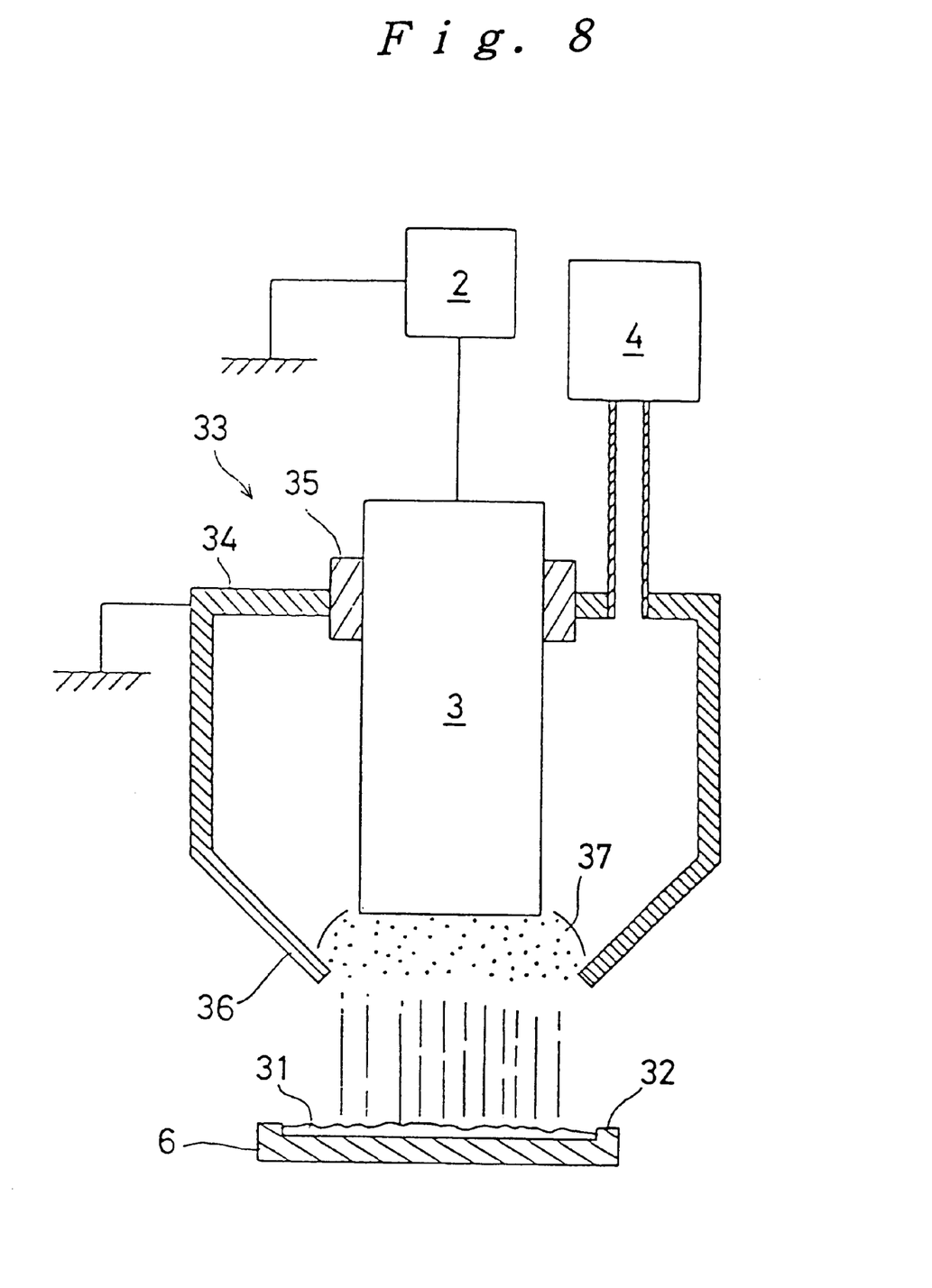
FIG. 8 is a diagram schematically showing a case of practicing the second embodiment of the method of the present invention by using the surface treatment apparatus shown in FIG. 7.

FIG. 8 shows a case where the method in accordance with the second embodiment of the present invention described with respect to FIG. 6 is practiced by using surface treatment apparatus 33 of FIG. 7. Liquid organic material 31 is previously applied to the surface of glass substrate 6 which is disposed below lower end portion 36 of metallic cover 34 at a certain distance therefrom, and on which running preventing frame 32 is provided. As in the case of FIG. 7, discharging gas is supplied from gas supply unit 4 to replace the interior of the metallic cover, and a predetermined voltage is applied to electrode 3 to cause gas discharge between the end of electrode 3 and metallic cover lower end portions 36.

In discharge region 37, the discharging gas is dissociated, ionized or excited by a plasma so that the energy state becomes higher, and activated species thereby generated are blown to the surface of substrate 6 by the downward gas flow from the opening of metallic cover lower end portions 36 toward substrate 6. A part of organic material 31 on substrate 6 is heated and evaporated by the gas flow and is dissociated or excited by being exposed to the discharge atmosphere or by receiving energy from the activated species of the discharging gas to become activated species. Organic material 31 remaining on substrate 6 receives energy from the activated species of the discharging gas in the high energy state and is dissociated or excited to become activated species. These activated species of the organic material combine and dissociate successively to form a polymerized film on the surface of substrate 6 directly from the gas or liquid phase.

Also in this embodiment, an experiment was made by using various carrier gases as discharging gas and various liquid organic materials on the substrate surface and by using a high frequency power source of 10 kHz, 400 kHz and 13.56 MHZ in the same manner as the embodiment of FIG. 6. The same results were thereby obtained.

Figure 9:
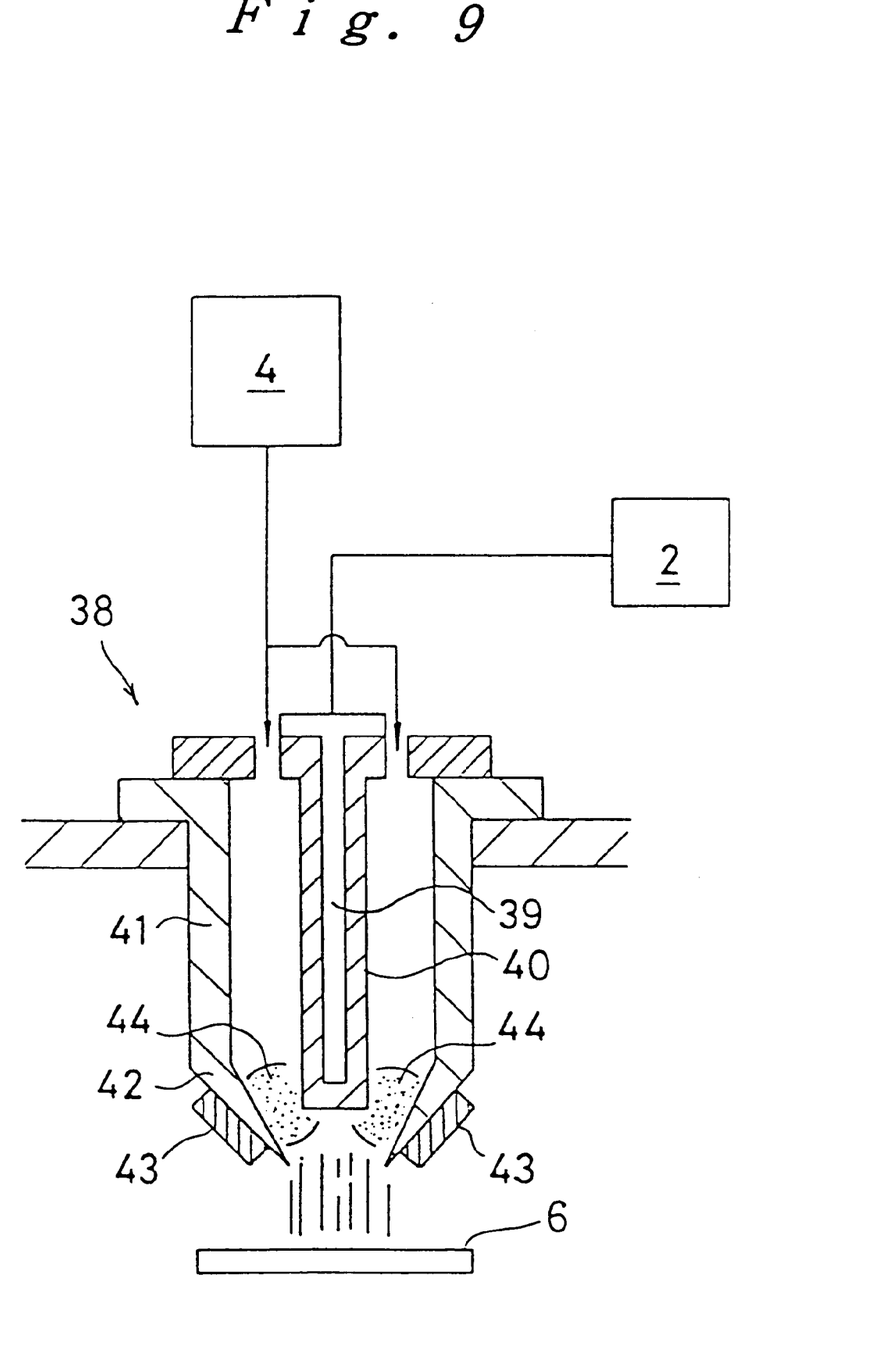
FIG. 9 is a diagram schematically showing still another arrangement of the surface treatment apparatus for practicing the first embodiment of the method of the present invention.

FIG. 9 shows a third embodiment of the surface treatment apparatus used in accordance with the present invention. This surface treatment apparatus 38 differs from the surface treatment apparatuses of FIGS. 1 and 2 in that a thin plate-like electrode 39 connected to a power source 2 is covered with a dielectric 40 such as quartz. A box-like guide 41 made of an insulating material and disposed on the outside of dielectric 40 so as to face to the same through a certain spacing has lower end portions 42 inwardly inclined so as to extend to positions in the vicinity of an end of electrode 39. Grounded electrodes 43 provided as electrodes opposed to power source electrode 39 are attached to outer surfaces of guide 41. Glass substrate 6 to be surface-treated is disposed below an elongated straight downward opening defined by guide lower end portions 42.

The interiors of the chambers between dielectric 40 and guide 41 are replaced with discharging gas containing an organic material supplied from gas supply unit 4, and a predetermined voltage is applied from power source 2 to electrode 39, whereby gas discharge is caused between electrodes 39 and 43 in the chamber. As in the case of the embodiments of FIGS. 1 and 7, activated species of the organic material generated by a plasma made in discharge regions 44 are blown to the substrate surface while being successively combined and dissociated by the gas flow jetted from the downward opening of guide lower end portions 42 toward substrate 6 by the discharging gas continuously supplied from gas supply unit 4, thereby forming a polymerized film directly from the gas phase.

In this embodiment, substrate 6 is not directly exposed to the gas discharge, so that thermal and electrical damages to the substrate can be reduced. Moreover, the deterioration of electrode 39 is reduced by the effect of the existence of dielectric 40, thereby improving the durability of the apparatus. Also in this embodiment, an experiment was made by using various carrier gases as discharging gas and various organic materials and by using a high frequency power source of the above-mentioned predetermined frequencies. The same results were thereby obtained.

Figure 10:
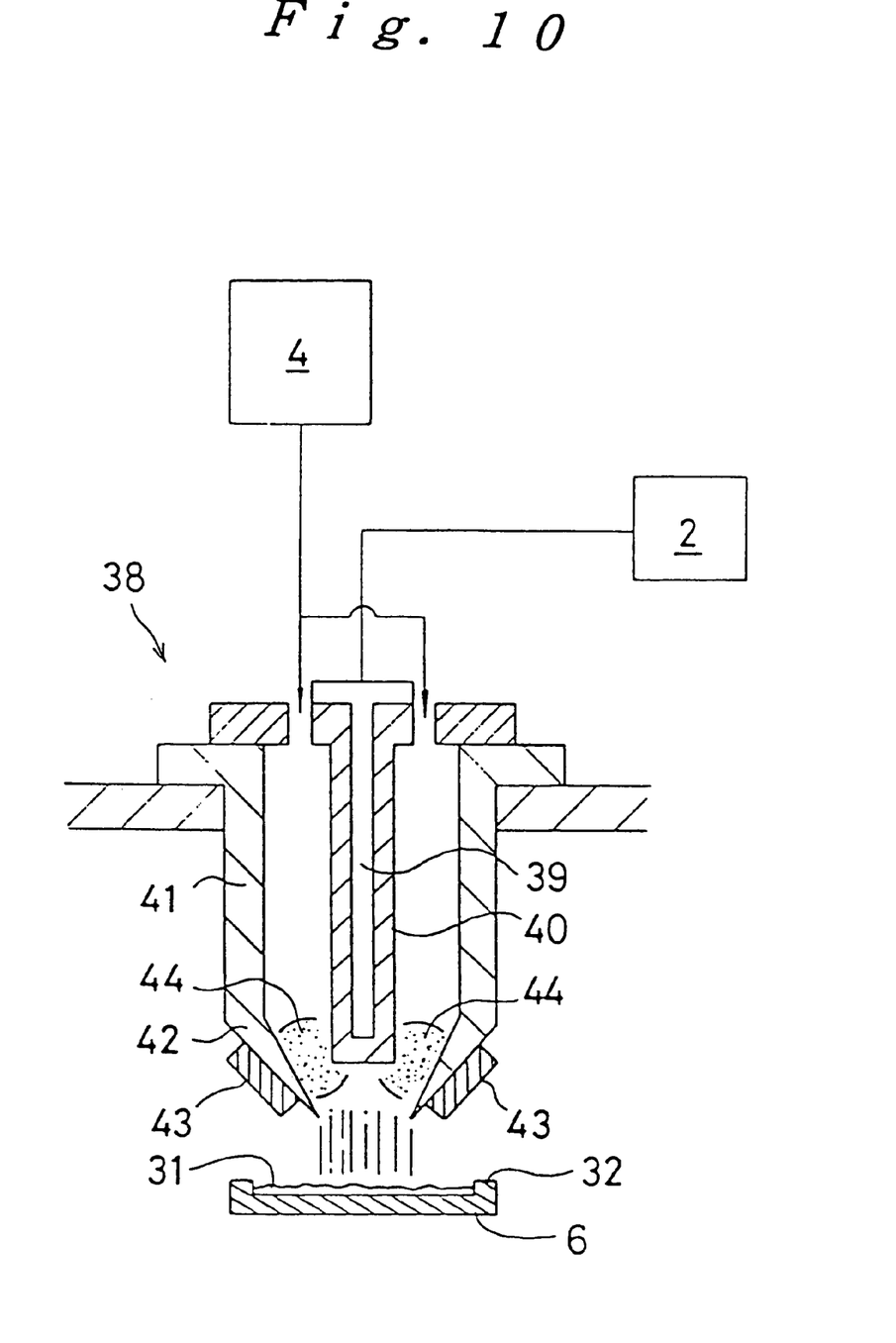
FIG. 10 is a diagram schematically showing a case of practicing the second embodiment of the method of the present invention by using the surface treatment apparatus shown in FIG. 9.

FIG. 10 shows a case where the method in accordance with the second embodiment of the present invention is practiced by using surface treatment apparatus 38 of FIG. 9, as in the case of FIG. 8. Liquid organic material 31 is previously applied to the surface of glass substrate 6 which is disposed below the downward opening defined by guide lower end portions 42 at a predetermined distance therefrom, and on which running preventing frame 32 is provided. The interiors of the chambers between dielectric 40 and guide 41 is replaced with discharging gas supplied from gas supply unit 4, and a predetermined voltage is applied to electrode 39 to cause gas discharge between in the chambers.

In discharge region 44, the discharging gas is dissociated, ionized or excited by a plasma so that the energy state becomes higher, and activated species thereby generated are blown to the surface of substrate 6 by the gas flow from the downward opening toward substrate 6. A part of organic material 31 is heated and evaporated by the gas flow and is dissociated or excited by being exposed to the discharge atmosphere or by receiving energy from the activated species of the discharging gas to become activated species. Organic material 31 remaining on the surface of substrate 6 receives energy from the activated species of the discharging gas in the high energy state and is dissociated or excited to become activated species. These activated species of the organic material combine and dissociate successively to form a polymerized film on the surface of substrate 6 directly from the gas or liquid phase.

Also in this embodiment, an experiment was made by using various carrier gases as discharging gas and various liquid organic materials on the substrate surface and by using a high frequency power source of predetermined frequencies in the same manner as the embodiments of FIGS. 6 and 8. The same result were thereby obtained.

Figure 11:
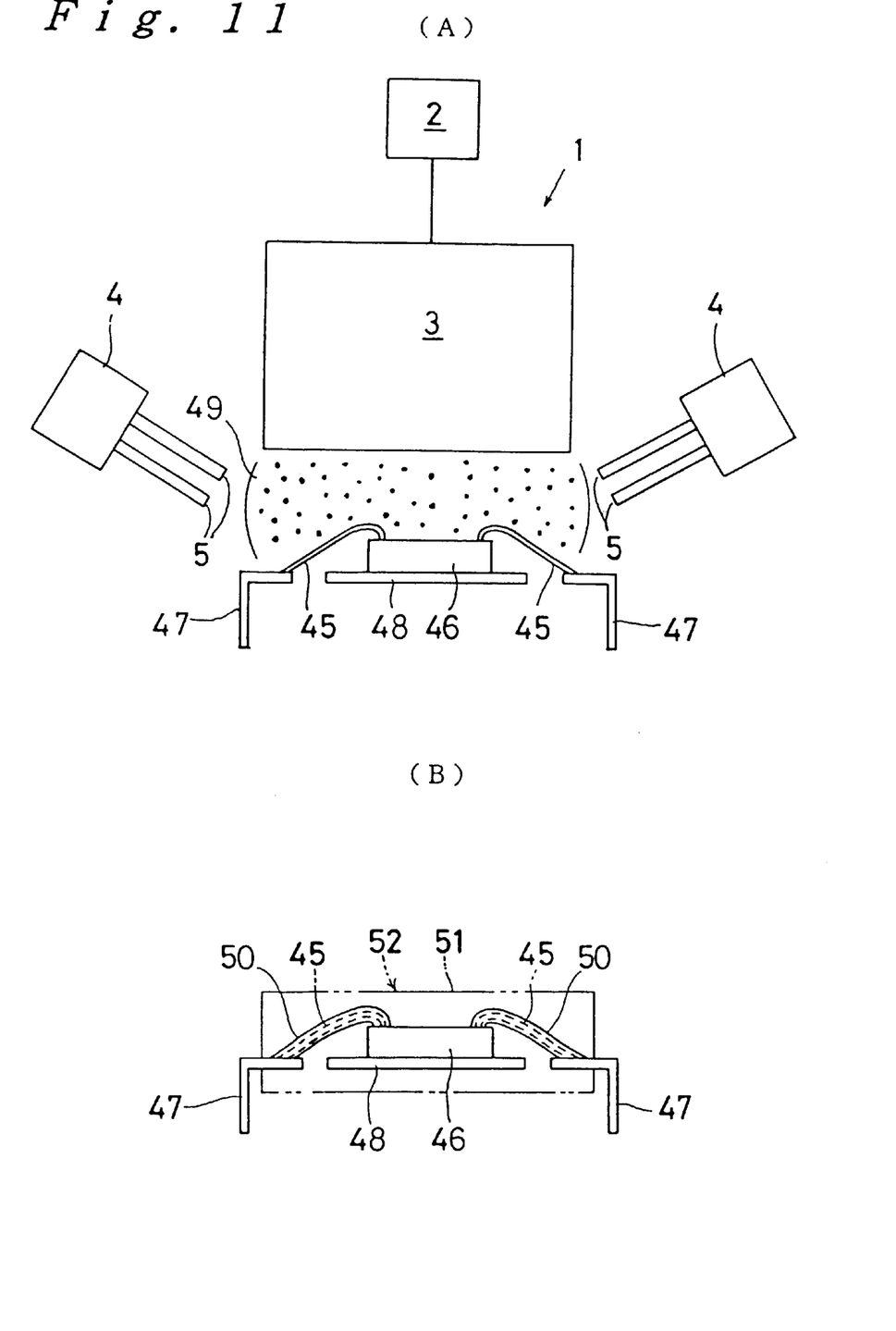
FIGS. 11(A) and 11(B) are diagrams showing steps of forming an insulating film on bonding wires for connecting an electronic part and outer leads by using a semiconductor device manufacturing method in accordance with the present invention.

The atmospheric-pressure plasma surface treatment method in accordance with the present invention can be applied to a method of manufacturing a package type semiconductor device by connecting electronic parts and outer leads by wire bonding, and by sealing the parts in a resin. FIG. 11 shows steps of covering bonding wires connecting an electronic part and outer leads with an insulating film by using surface treatment apparatus 1 of FIG. 1.

As shown in FIG. 11(A), an electronic part 46 and outer leads 47 connected by bonding wires 45 made of, for example, gold or aluminum are disposed immediately below the end of electrode 3 with a predetermined spacing set therebetween. Electronic part 46 and outer leads 47 of this embodiment are provided to manufacture a DIP (dual inline package) type semiconductor device. Bare chip electronic part 46 is bonded on die pads 48.

Next, discharging gas containing a predetermined organic material is supplied from gas supply units 4 to replace an atmosphere between the end of electrode 3 and bonding wires and in the vicinity of the same. When a predetermined voltage is applied from power source 2 to electrode 3, gas discharge is caused between the end of electrode 3 and bonding wires 45. In this discharge region 49, reaction of the discharging gas such as dissociation, ionization or excitation is caused by a plasma, thereby generating activated species of the organic material. These activated species are successively combined and dissociated to form a polymerized film directly from the gas phase on the surfaces of bonding wires 45 exposed to the gas discharge.

Any organic material may be used as organic material to be contained in the above-mentioned discharging gas including organic materials such as silicone and organic metallic compounds containing inorganic elements. As carrier gas, any noble gas such as helium and other various gases such as those mentioned above may be used and oxygen may be added to the carrier gas. The carrier gas and the organic material are thus selected and an insulating film 50 is formed according to the selected organic material, as shown in FIG. 11(B). If, for example, silicone is used as the above-mentioned organic material, insulating film 50 is formed of Si film or SiO2 film as described above with reference to FIG. 1. Electronic part 46 and outer leads 47 with bonding wires 45 surface-treated in this manner are sealed in resin 51 by a well-known method to form package 52, as shown in FIG. 11(B). In this embodiment, surface treatment apparatus 1 of FIG. 1 was used. Needless to say, however, surface treatment apparatus 33 or 38 of FIG. 7 or 8 can also be used to perform the same surface treatment.

If the bonding wires are previously processed to be insulated, the connection between the electrode pads for electronic part 46 and the connection of outer leads 47 becomes difficult. According to the method of the present invention, however, even if the pitch of the bonding wires connected by wiring is very small, the bonding wires can easily be surface treated after the connection. Thus, bonding wires 45 are covered with insulating film 49 to eliminate the risk of short-circuit of the adjacent bonding wires before resin molding, thereby achieving an improvement in yield and a reduction in manufacturing cost while satisfying conditions with respect to miniaturization of the semiconductor device (IC) and a reduced pitch of bonding pads. In particular, a plasma surface treatment under atmospheric pressure can be performed and, accordingly, the construction of the apparatus is simple and the treatment time is short. Therefore, an inline process can easily be arranged and the productivity can be further improved.

Figure 12:
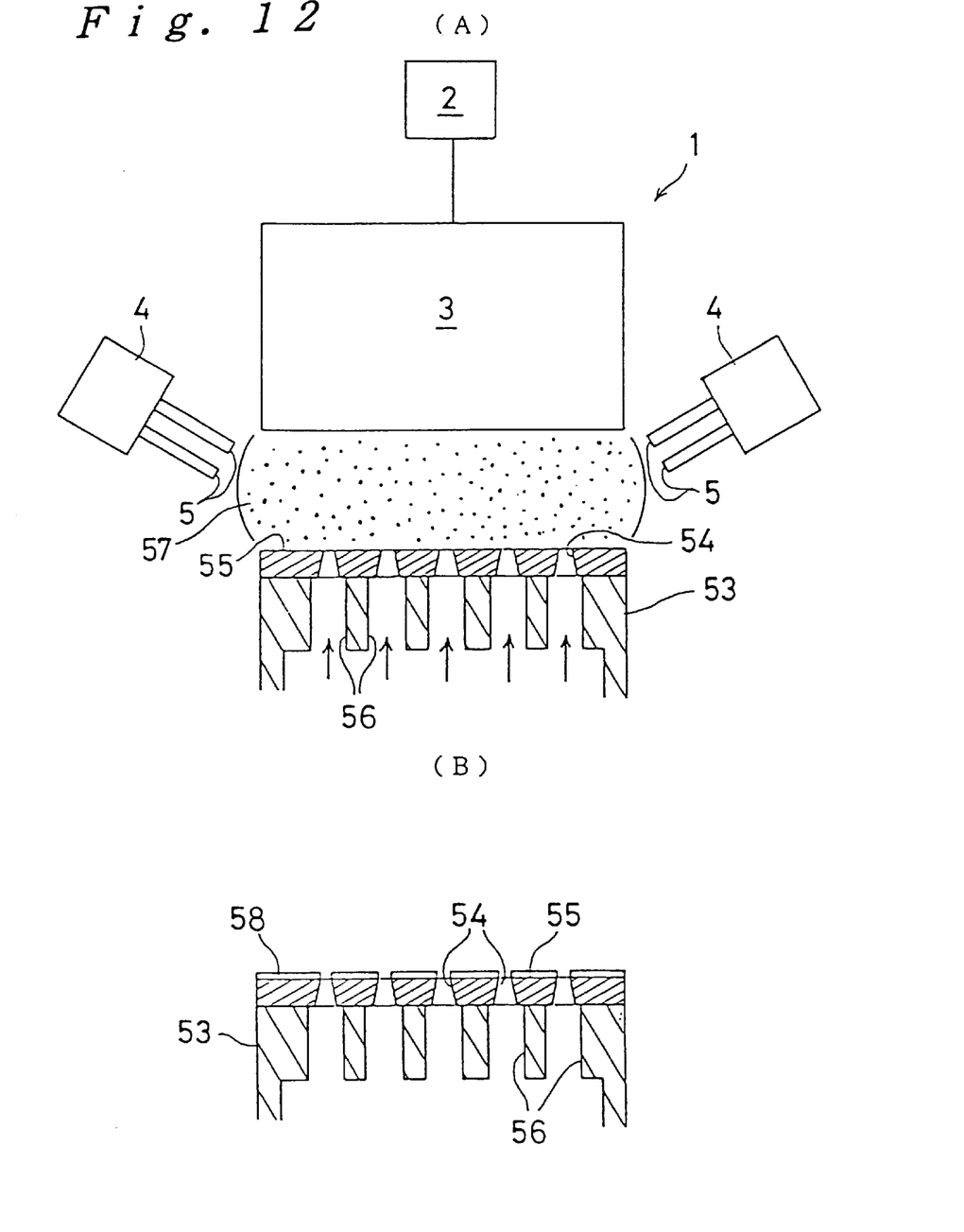
FIGS. 12(A) and 12(B) are diagrams showing steps of surface-treating an end surface of a printer head, in which a multiplicity of fine ink jet holes are formed by being opposed to a printing side, by using an ink jet type printing head manufacturing method in accordance with the present invention.

The atmospheric-pressure plasma surface treatment method in accordance with the present invention can be applied to a method of manufacturing a printing head for use in an ink jet type printer. FIG. 12 shows steps of surface-treating an ink jet surface of a printing head.

As shown in FIG. 12(A), a printing head 53 is disposed immediately below the end of electrode 3 with a predetermined spacing so that ink jet surface 55 having fine ink jet holes 54 faces upward on the printing side. Next, discharging gas containing a predetermined organic material is supplied from gas supply units 4 to replace an atmosphere between the end of electrode 3 and printing head 53 and in the vicinity of the same. In this embodiment, as the discharging gas, a mixture gas was used which contains helium as carrier gas and a hydrocarbon as organic material, and to which $CF_4$ is also added. However, any other kinds of gases and organic materials can be used as long as a water-repellent property can be given as described above with reference to FIG. 1. As kinds of liquid, perfluorocarbon, silicone, an organic material containing fluorine and silicone fluoride are preferred. If such material is used, it is not always necessary to add $CF_4$.

Also, according to the present invention, the above-described discharging gas is supplied form gas supply unit 4 while a gas such as helium or a mixture gas of helium and oxygen for giving a hydrophilic property is supplied from an internal portion of printing head 53 toward ink jet holes 54 through ink passages 56 communicating with ink jet holes 54. As such a gas, oxygen, a gas such as $CO_2$, $H_2O$, or NOX containing oxygen, or a gas such as NOX or $NH_3$ containing nitrogen may be used singly or by being mixed with any of the above-mentioned various carrier gases, e.g., helium and argon, as described above with reference to FIG. 1.

When a predetermined voltage is applied from power source 2 to electrode 3, gas discharge is caused between the end of electrode 3 and printing head 53. In this discharge region 57, the discharging gas is dissociated, ionized or excited by a plasma to generate activated species of the organic material. These activated species combine and dissociate successively to form water-repellent polymerized film 58 directly from the gas phase on ink jet surface 55 exposed to the gas discharge, as shown in FIG. 12(B). On the other hand, at the inner surfaces of ink jet holes 54, the gas supplied through ink passages 56 is dissociated or excited to generate activated species by receiving energy from the activated species generated in discharge region 57, and, therefore, no water-repellent polymerized film is formed; conversely, a hydrophilic property is given. It is therefore possible to obtain an ink jet type printing head in which ink can sufficiently fill ink passages 56 and ink jet holes 54, in which, when piezoelectric elements are operated, ink can be smoothly jetted to a printed surface without remaining at ink jet surface 55, and which is capable of always obtaining sharp prints by preventing scattering or dispersion of ink.

The conventional printing heads are manufactured in such a manner that ink jet holes 54 are previously charged with a resist material and ink jet surface 55 is processed by, for example, eutectoid plating with Teflon and nickel. Therefore, the number of process steps is large, and a long time and a large amount of labor are required, thereby reducing the productivity and increasing the manufacturing cost. In contrast, according to the present invention, a plasma surface treatment is made under atmospheric pressure as described above to reduce the treatment time to about 10 seconds, which is amount $\frac{1}{10}$ of that of the conventional art, and to reduce the manufacturing cost to about $\frac{1}{200}$ of that of the conventional art. Moreover, the equipment and the apparatus can be reduced in size by adopting a comparatively simple arrangement, so that an inline process can easily realized and the productivity can be remarkably improved. Also in this embodiment, the surface treatment apparatus of FIG. 1 was used. Needless to say, similar effect can also be obtained by using surface treatment apparatus 33 or 38 of FIG. 7 or 9.

The preferred embodiments of the present invention have been described in detail. However, as can easily be understood by those skilled in the art, the present invention is not limited to the above-described embodiments, and the present invention can be practiced by variously changing and modifying the above-described embodiments within the technical scope of the invention.

What is claimed is:

1. A method of manufacturing an ink jet type printing head having an ink jet surface in which holes for selectively jetting ink are formed, comprising the steps of:

generating plasma discharge in a predetermined gas capable of discharge at or about atmospheric pressure;

using said plasma discharge to create excited and activated species of an organic material which is liquid at room temperature, said organic material selected from the group consisting of silicones, fluorocarbons or hydrocarbons and combinations thereof;

forming a film on the ink jet surface by exposure of the surface to said excited and activated species; and providing a gas selected from the group consisting of helium, oxygen, compounds containing oxygen and nitrogen and combinations thereof through said holes toward said ink jet surface from an opposite side of said ink jet surface at least during said forming step.

2. The method of claim 1 wherein the gas selected from the group consisting of helium, oxygen, compounds containing oxygen and nitrogen and combinations hereof contains hydrophillic properties.

3. The method of claim 1 wherein the film formed on the ink jet surface is a water-repellent polymerized film.

* * * * *